United States Patent
Dong et al.

(10) Patent No.: US 7,623,387 B2
(45) Date of Patent: *Nov. 24, 2009

(54) NON-VOLATILE STORAGE WITH EARLY SOURCE-SIDE BOOSTING FOR REDUCING PROGRAM DISTURB

(75) Inventors: Yingda Dong, Sunnyvale, CA (US); Jeffrey W. Lutze, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/609,813

(22) Filed: Dec. 12, 2006

(65) Prior Publication Data

US 2008/0137426 A1 Jun. 12, 2008

(51) Int. Cl.
*G11C 16/04* (2006.01)
(52) U.S. Cl. .................... 365/185.18; 365/185.17; 365/185.02; 365/185.26; 365/185.28
(58) Field of Classification Search ............ 365/185.18, 365/185.17, 185.02, 185.26, 185.28
See application file for complete search history.

(56) References Cited

U.S. PATENT DOCUMENTS

| | | | |
|---|---|---|---|
| 5,386,422 A | 1/1995 | Endoh | |
| 5,570,315 A | 10/1996 | Tanaka | |
| 5,677,873 A | 10/1997 | Choi | |
| 5,715,194 A | 2/1998 | Hu | |
| 5,774,397 A | 6/1998 | Endoh | |
| 5,991,202 A | 11/1999 | Derhacobian | |
| 6,011,287 A | 1/2000 | Itoh | |
| 6,046,935 A | 4/2000 | Takeuchi | |
| 6,222,762 B1 | 4/2001 | Guterman | |
| 6,456,528 B1 | 9/2002 | Chen | |
| 6,522,580 B2 | 2/2003 | Chen | |
| 6,522,583 B2 | 2/2003 | Kanda | |
| 6,859,395 B2 | 2/2005 | Matsunaga | |
| 6,859,397 B2 | 2/2005 | Lutze | |

(Continued)

FOREIGN PATENT DOCUMENTS

WO  2005104135  11/2005

OTHER PUBLICATIONS

U.S. Appl. No. 11/609,804, filed Dec. 12, 2006.

(Continued)

*Primary Examiner*—Amir Zarabian
*Assistant Examiner*—Fernando N Hidalgo
(74) *Attorney, Agent, or Firm*—Vierra Magen Marcus & DeNiro LLP

(57) ABSTRACT

Non-volatile storage with reduced program disturb is provided by boosting unselected NAND strings in an array so that a source side channel, on a source side of a selected word line, is boosted before a drain side channel, on a drain side of the selected word line. In one approach, a first boost mode is used when the selected word line is a lower or intermediate word line. In the first boost mode, boosting of the source and drain side channels is initiated concurrently. A second boost mode is used when the selected word line is a higher word line. In the second boost mode, boosting of the source side channel occurs early relative to the boosting of the drain side channel. Either boost mode include an isolation voltage which tends to isolate the source and drain side channels from one another.

20 Claims, 15 Drawing Sheets

U.S. PATENT DOCUMENTS

| | | | |
|---|---|---|---|
| 6,975,537 | B2 | 12/2005 | Lutze |
| 6,987,694 | B2 | 1/2006 | Lee |
| 7,009,881 | B2 | 3/2006 | Noguchi |
| 7,020,026 | B2 | 3/2006 | Guterman |
| 7,023,737 | B1 | 4/2006 | Wan |
| 7,046,568 | B2 | 5/2006 | Cernea |
| 7,054,195 | B2 | 5/2006 | Matsunaga |
| 7,088,621 | B2 | 8/2006 | Guterman |
| 7,123,518 | B2 | 10/2006 | Cheng |
| 7,161,833 | B2 | 1/2007 | Hemink |
| 7,170,788 | B1 | 1/2007 | Wan |
| 7,170,793 | B2 | 1/2007 | Guterman |
| 7,184,308 | B2 | 2/2007 | Kwon |
| 7,196,928 | B2 | 3/2007 | Chen |
| 2002/0003722 | A1 | 1/2002 | Kanda |
| 2004/0057287 | A1 | 3/2004 | Cernea |
| 2004/0109357 | A1 | 6/2004 | Cernea |
| 2004/0174748 | A1* | 9/2004 | Lutze et al. ............ 365/185.28 |
| 2004/0255090 | A1 | 12/2004 | Guterman |
| 2005/0024939 | A1 | 2/2005 | Chen |
| 2005/0105334 | A1* | 5/2005 | Futatsuyama .......... 365/185.17 |
| 2005/0174852 | A1 | 8/2005 | Hemink |
| 2006/0126390 | A1 | 6/2006 | Gorobets |
| 2006/0140007 | A1 | 6/2006 | Cernea |
| 2006/0140012 | A1 | 6/2006 | Wan |
| 2006/0158947 | A1 | 7/2006 | Chan |
| 2006/0164904 | A1 | 7/2006 | Saleh |
| 2006/0198195 | A1 | 9/2006 | Hemink |
| 2006/0203557 | A1 | 9/2006 | Fukuda |
| 2006/0250850 | A1 | 11/2006 | Lee |

OTHER PUBLICATIONS

International Search Report dated Jun. 9, 2008, PCT Patent Appl. No. PCT/US2007/086981, filed Oct. 12, 2007.

Written Opinion of the International Searching Authority dated Jun. 9, 2008, PCT Patent Appl. No. PCT/US2007/086981, filed Oct. 12, 2007.

European Office Action dated Sep. 2, 2009, European Patent Application No. 07865470.4.

* cited by examiner

Unselected NAND string, 400

Erased area self-boosting mode

Revised erased area self-boosting mode (1)

| | | |
|---|---|---|
| $V_{SGD}$ | SGD | |
| $V_{PASS}$ | WL7 | Revised erased area self-boosting mode (2) |
| $V_{PASS}$ | WL6 | |
| $V_{PGM}$ | WL5 | |
| $V_{LOW}=4\text{ V}$ | WL4 | |
| $V_{ISO}=0\text{ V}$ | WL3 | |
| $V_{PASS}$ | WL2 | |
| $V_{PASS}$ | WL1 | |
| $V_{PASS}$ | WL0 | |
| $V_{SGS}$ | SGS | |

| | | |
|---|---|---|
| $V_{SGD}$ | SGD | |
| $V_{PASS}$ | WL7 | Revised erased area self-boosting mode (3) |
| $V_{PASS}$ | WL6 | |
| $V_{PGM}$ | WL5 | |
| $V_{PASS}$ | WL4 | |
| $V_{PASS}$ | WL3 | |
| $V_{LOW}=4\text{ V}$ | WL2 | |
| $V_{ISO}=0\text{ V}$ | WL1 | |
| $V_{PASS}$ | WL0 | |
| $V_{SGS}$ | SGS | |

NON-VOLATILE STORAGE WITH EARLY SOURCE-SIDE BOOSTING FOR REDUCING PROGRAM DISTURB

CROSS-REFERENCE TO RELATED APPLICATIONS

This application is related to co-pending, commonly assigned U.S. patent application Ser. No. 11/609,804, filed herewith, titled "Reducing Program Disturb In Non-Volatile Storage Using Early Source-Side Boosting", incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," published Feb. 3, 2005; both of which are incorporated herein by reference in their entirety.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed.

SUMMARY OF THE INVENTION

The present invention addresses the above and other issues by providing non-volatile storage with reduced program disturb.

In one embodiment, a non-volatile storage system includes a set of non-volatile storage elements formed, at least in part, on a substrate, and a set of word lines associated with the set of non-volatile storage elements, including a selected word line which is associated with at least one non-volatile storage element of the set of non-volatile storage elements. The system further includes one or more control circuits in communication with the set of non-volatile storage elements. The one or more control circuits boost a first region of the substrate on a source side of the selected word line, and boost a second region of the substrate on a drain side of the selected word line. In particular, the one or more control circuits initiate boosting of the first region early relative to the boosting of the second region. This approach can be used, e.g., with a boosting mode in which an isolation word line tends to isolate the first and second regions from one another.

The boosting of the first region include applying a pass voltage to at least one word line on the source side of the selected word line, and the boosting of the second region includes applying a pass voltage to at least one word line on the drain side of the selected word line.

The set of non-volatile storage elements can be provided in at least one NAND string which extends between a source side select gate and a drain side select gate, in which case the one or more control circuits maintain the source side select gate and the drain side select gate closed during the boosting of the first and second regions.

Further, a program voltage can be applied to the at least one non-volatile storage element via the selected word line during the boosting of the first and second regions. In one approach, the program voltage is applied initially at a first level and subsequently at a higher second level.

In another embodiment, a non-volatile storage system includes first and second groups of non-volatile storage elements in a set of non-volatile storage elements. The first group includes programmed non-volatile storage elements and the second group includes unprogrammed non-volatile storage elements. The system further includes one or more control circuits in communication with the set of non-volatile storage elements. The one or more control circuits apply pass voltages to the first and second groups of non-volatile storage elements, where the pass voltages are applied to the first group prior to being applied to the second group. Further, during at least part of a time period involving the applying of the pass voltages, the one or more control circuits apply a programming voltage to at least one non-volatile storage element in the set of non-volatile storage elements which is not in the first or second groups. The set of non-volatile storage elements can be provided in at least one NAND string which extends between a source side select gate and a drain side select gate, in which case the first group can be adjacent to the source side select gate and the second group can be adjacent to the drain side select gate.

In another embodiment, a non-volatile storage system includes a set of non-volatile storage elements formed, at least in part, on a substrate, and a set of word lines associated with the set of non-volatile storage elements, including a selected word line which is associated with at least one non-volatile storage element of the set of non-volatile storage elements. The system further includes one or more control circuits in communication with the set of non-volatile storage elements. The one or more control circuits program non-volatile storage elements in the set of non-volatile storage elements by applying a programming voltage on the selected word line. Prior to applying the programming voltage, the one or more control circuits initiate boosting of a first region of the substrate on a source side of the selected word line and initiate boosting of a second region of the substrate on a drain side of the selected word line. In particular, a timing of the initiating boosting of the first region relative to the initiating boosting of the second region is based on a position of the selected word line in the set of word lines.

For example, the initiating boosting of the first region can occur early relative to the initiating boosting of the second region when the position of the selected word line is among a group of word lines of the set of word lines which is adjacent to a drain side of the set of non-volatile storage elements. Moreover, the initiating boosting of the first region can occur concurrently with the initiating boosting of the second region when the position of the selected word line is not among the group of word lines. The group of word lines consists of fewer than all word lines in the set of word lines.

DETAILED DESCRIPTION

The present invention provides non-volatile storage with reduced program disturb.

Figure 1:
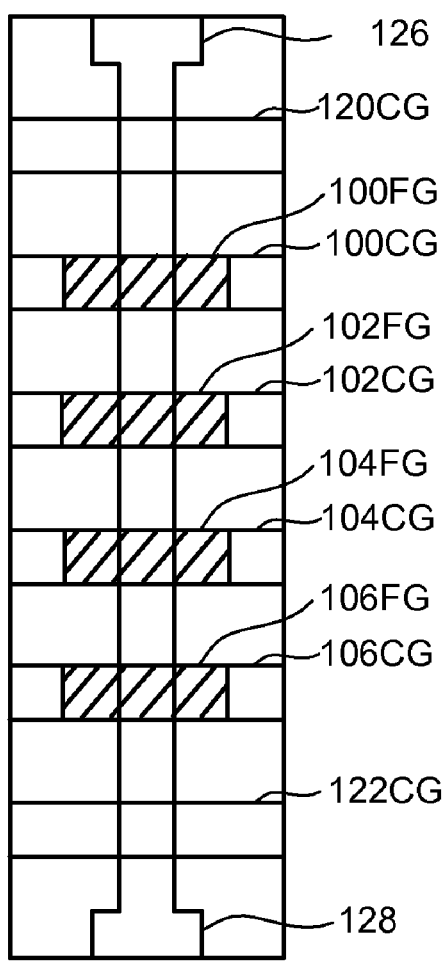
FIG. 1 is a top view of a NAND string.
Figure 2:
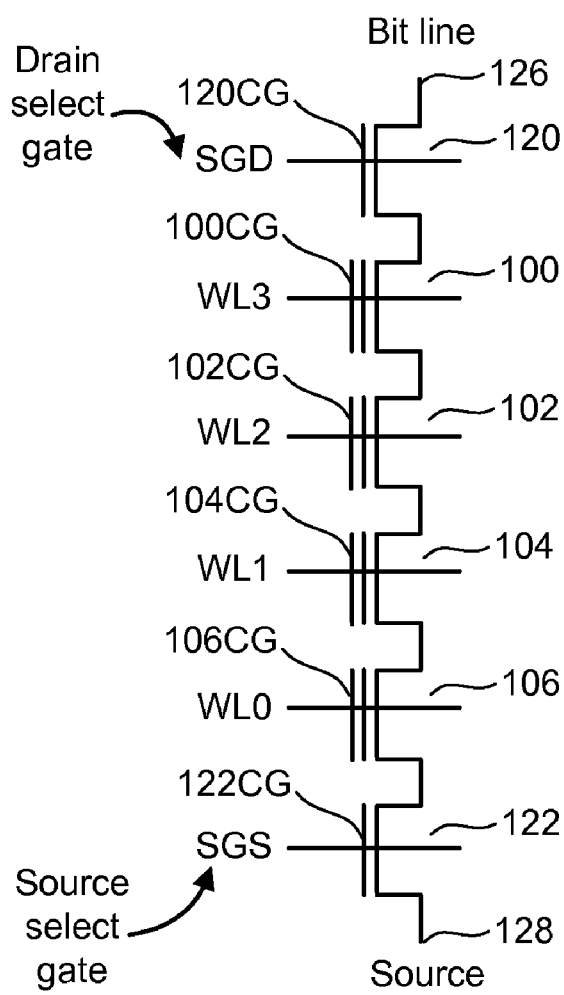
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD. Select gate 122 is connected to select line SGS.

Figure 3:
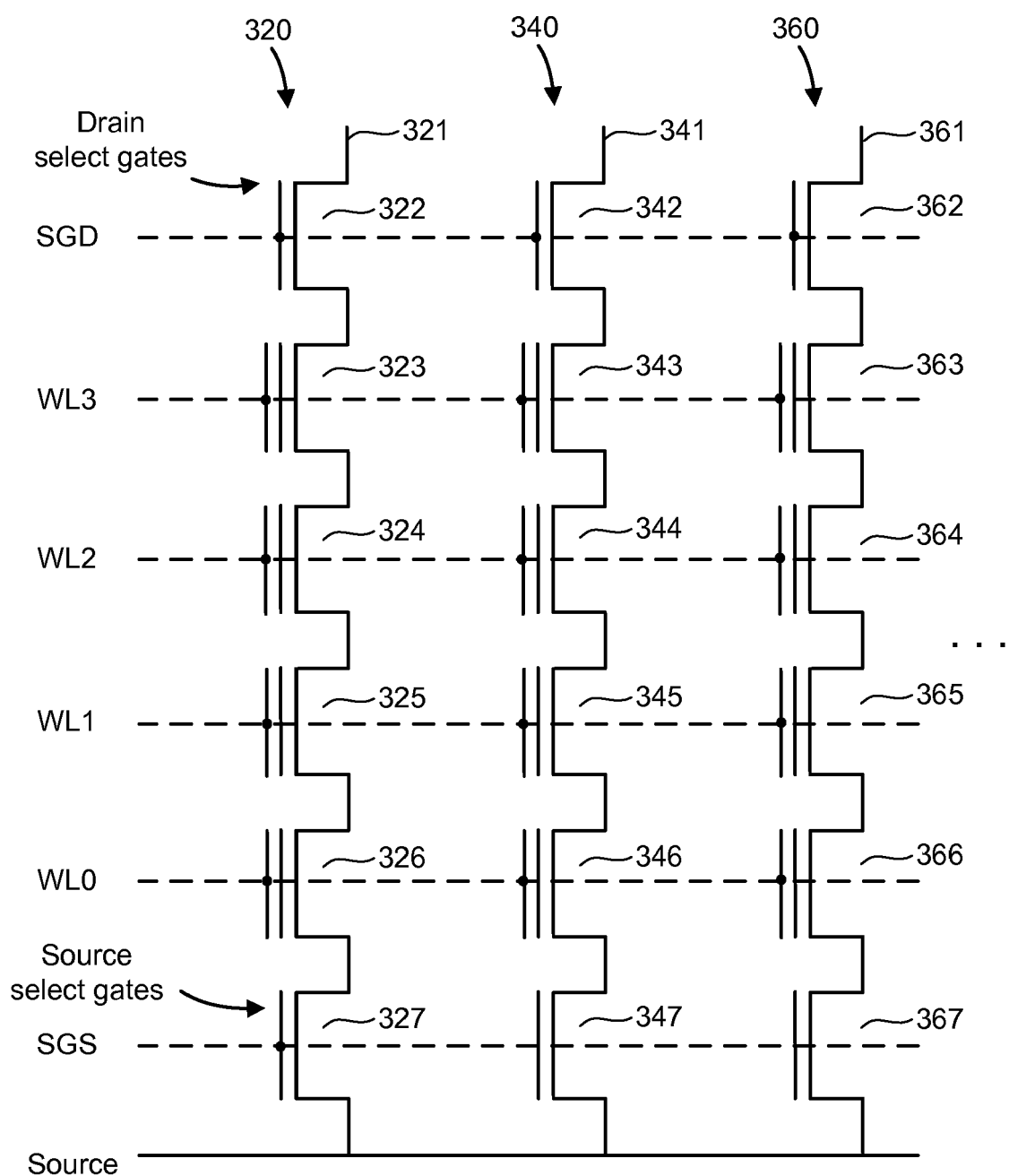
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522,580, 5,570,315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, $V_{PASS}$, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the charge stored in a programmed storage element due to capacitive coupling between storage elements, can also be problematic.

Figure 4:
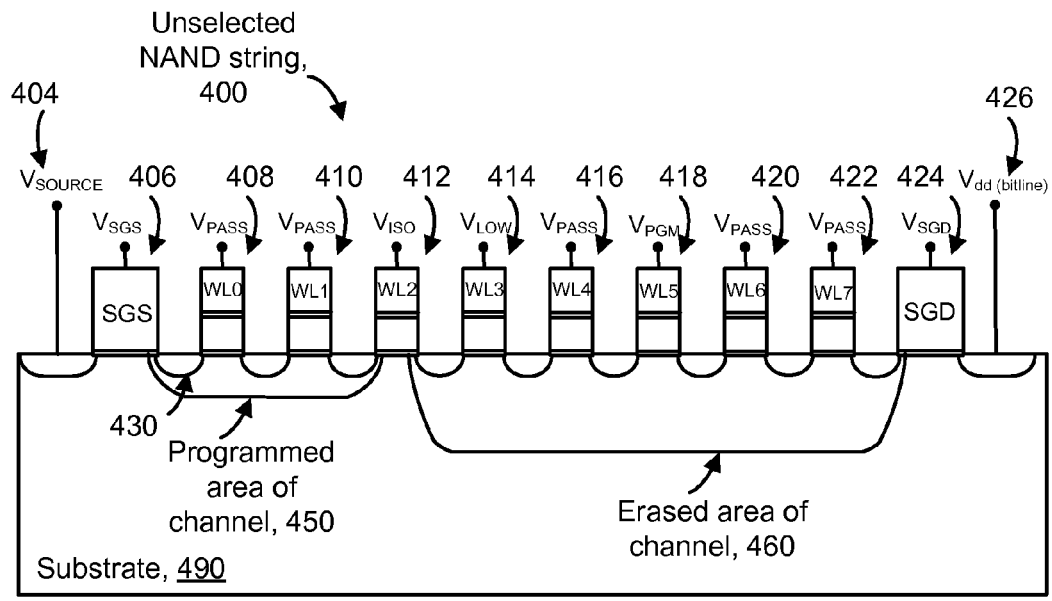
FIG. 4 depicts a cross-sectional view of an unselected NAND string showing programmed and erased areas.
Figures 7A, 7B, 8:
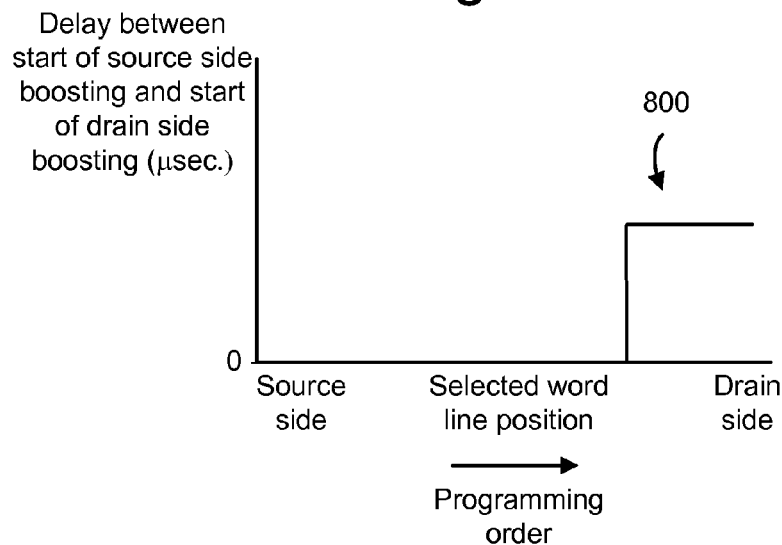
FIG. 7a depicts a second revised erased area self-boosting mode implemented via a plurality of word lines.
FIG. 7b depicts a third revised erased area self-boosting mode implemented via a plurality of word lines.
FIG. 8 depicts a delay between the start of source side boosting and the start of drain side boosting as a function of selected word line position.

FIG. 4 depicts a cross-sectional view of an unselected NAND string showing programmed and erased areas with revised erased area self-boosting (REASB), such as depicted in FIG. 7b. The view is simplified and not to scale. The NAND string 400 includes a source-side select gate 406, a drain-side select gate 424, and eight storage elements 408, 410, 412, 414, 416, 418, 420 and 422, formed on a substrate 490. The components can be formed on an n-well region which is on a p-well region of the substrate. The p-well can in turn be formed on a p-substrate region. A source supply line 404 with a potential of $V_{SOURCE}$ is provided in addition to a bit line 426 with a potential of $V_{dd\ (bit\ line)}$. During programming, $V_{PGM}$ is provided on a selected word line, in this case, WL5, which is associated with a selected storage element 418. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively.

In one example boosting scheme, when storage element 418 is the selected storage element, a relatively low voltage, $V_{LOW}$, e.g., 4 V, is applied to a neighboring source-side word line (WL3), while an isolation voltage, $V_{ISO}$, e.g., 0-2.5 V, is applied to another source-side word line (WL2), referred to as an isolation word line and $V_{PASS}$ is applied to the remaining word lines associated with NAND string 400 (i.e., WL0, WL1, WL4, WL6 and WL7). $V_{SGS}$ is applied to the select gate 406 and $V_{SGD}$ is applied to the select gate 424.

Assuming programming of storage elements along the NAND string 400 progresses from storage element 408 to storage element 422, when storage elements associated with WL5 in other NAND strings are being programmed, storage elements 408-416 will already have been programmed, and storage elements 420 and 422 will not yet have been programmed. Note that storage element 418 is not programmed when the NAND string 400 is inhibited, in this example, even though a program voltage is applied on WL5. Thus, all or some of storage elements 408-416 will have electrons programmed into and stored in their respective floating gates, and storage elements 420 and 422 can be erased or partially programmed, depending on the programming mode. For example, the storage elements 420 and 422 may be partially programmed when they have been previously programmed in the first step of a two-step programming technique.

With the EASB or REASB boosting mode, $V_{ISO}$ is applied to one or more source-side neighbors of the selected word line and is sufficiently low to isolate programmed and erased channel areas in the substrate, at some point after boosting is initiated. That is, a channel area 450 of the substrate on a source-side of the unselected NAND string 400 is isolated from a channel area 460 on a drain-side of the unselected NAND string 400. The source side can also be considered to be a programmed side since most or all of the associated storage elements have been programmed, while the drain side can also be considered to be an unprogrammed side since the associated storage elements have not yet been programmed. Further, the channel area 450 is a first boosted region of the substrate 490 which is boosted by the application of $V_{PASS}$ on WL0 and WL1, while the channel area 460 is a second boosted region of the substrate 490 which is boosted mainly by the application of $V_{PGM}$ on WL5 and $V_{PASS}$ on WL4, WL6 and WL7. Since $V_{PGM}$ dominates, the erased area 460 will experience relatively higher boosting than the programmed area 450. Moreover, the channel boosting may be provided for a time period before $V_{PGM}$ is applied, at which time the channel areas 450 and 460 are similarly boosted.

However, program disturb tends to happen on high word lines (e.g., between WL24 and WL31 on a 32-word line NAND memory device) when $V_{PASS}$ is relatively low, e.g., 8 V or less. Note that the highest word line, WL31, is also susceptible to this kind of program disturb failure, although it normally fares better than the other affected word lines (e.g., WL24-WL30) because, when WL31 is selected for programming, the drain side channel capacitance is small. As a result, $V_{PGM}$ contributes more to the channel boosting. Generally, the program disturb failure is problematic for approximately the highest 25% of the word lines. For example, for a 64-word line NAND memory device, WL48-WL63 will have a similar program disturb failure problem. This is true because this kind of program disturb failure happens when the source side channel capacitance becomes significantly larger than drain side channel capacitance by a certain proportion.

For example, when REASB mode is used for channel boosting, the inhibited NAND string is separated into two regions (source side and drain side) and disturbs are caused by insufficient boosting in the drain side channel. In particular, evidence indicates that the low boosting potential on the drain side of the channel is caused by charge leakage from the drain to the source side during the initial stage of the boosting before the isolation storage element is completely off. For example, with storage element 418 as the currently selected storage element, storage element 412 as the isolation storage element may not be completed off when boosting is initiated by applying $V_{PASS}$ to the other word lines. This leakage lowers the drain side channel boosting potential. And, since the to-be-programmed storage element (e.g., storage element 418) is located on the drain side of the NAND string, the low drain side channel potential can directly cause an insufficient boosting type of program disturb failure. Moreover, experimental data shows that these program disturb failures are particularly prevalent when the two storage elements on WL2 and WL3 (e.g., on WLn–3 and WLn–2 when WLn represents the selected word line) are both in the erased state.

To solve this problem, we propose boosting up the source side channel potential before boosting up the drain side channel potential. This approach has three benefits of increasing the drain side boosting efficiency. First, after source side boosting is initiated, the isolation storage element is more likely to be cut off when the drain side starts to boost afterwards. This can significantly reduce or even remove the electrons flowing from the source side to the drain side during the initial stage of channel boosting. Second, during the source side boosting, some electrons will flow in a leakage current from the drain side channel to the source side channel before the isolation storage element cuts off. This effectively adds positive charges (holes) in the drain side channel, as a result of which the drain side boosting becomes easier. Third, the proposed boosting approach reverses the lateral field direction during the initial stage of the drain side channel boosting, so that, even if the isolation storage element is still not completely turned off when the drain side boosting is initiated, the electrons will leak from the drain side to the source side. This can only increase the drain side channel potential instead of lowering it.

The validity of this approach is confirmed by observations which indicate that when a higher $V_{PASS}$ is used to boost the source side channel vs. boosting the drain side channel, the drain side channel potential becomes higher and the disturb failures decrease. Measurements also indicate that after boosting becomes stable, the isolation storage element is sufficiently cut off. The fact that a higher $V_{PASS}$ on the source side of the selected word line can improve drain side boosting potential likely can be explained as follows. When boosting just starts, the channel potentials on the source and drain sides both increase, but because the source side channel is not pre-charged, and the source side storage elements are already heavily programmed, the drain side channel potential will be higher than that in the source side. Specifically, many storage elements on the source side are already programmed, and therefore have $V_{TH}$>0 V. During one type of pre-charge, 0 V is applied on all the word lines, as a result of which the programmed storage elements on the source side cannot be turned on, and $V_{dd}$ on the bit line can not be transferred into the source side channel. Further all drain side storage elements are erased ($V_{TH}$<0), and therefore they are turned on during pre-charge and can transfer $V_{dd}$ into the drain side channel. As a result, the source side channel does not get pre-charged, while drain side channel does.

Thus, when the boosting just starts, the source side channel potential is still not high enough to cut off the isolation storage element. During a short period of time, electrons will flow from the source side to the drain side until the isolation storage element is off.

Additionally, when the selected word line is a higher word line, e.g., a word line close to the drain side of a set of storage elements, the drain side channel capacitance is relatively small, and the charge leakage can significantly lower the final drain side channel boosting potential. As a result, this kind of disturb failure tends to be more prevalent when the selected word lines are higher word lines. If a higher $V_{PASS}$ is used on the source side word lines, the initial channel potential difference between the source and drain sides becomes smaller, so that the lateral field across the isolation storage element is weaker. As a result, the initial boosting leakage current from the drain to the source side will be smaller, and there will be less boosting potential loss in the drain side channel. However, a high $V_{PASS}$ can cause $V_{PASS}$ disturb on the erased storage elements on the source side and can exacerbate another fail mode which involves drain side hot electron injection disturb in channels being programmed. Due to these two reasons, it is not good to increase $V_{PASS}$ on the source side channel. On the other hand, if $V_{PASS}$ is too low, boosting in the channel will be insufficient to prevent program disturb. The boosting approach described herein reduces program disturb without the need to adjust $V_{PASS}$.

Figure 5:
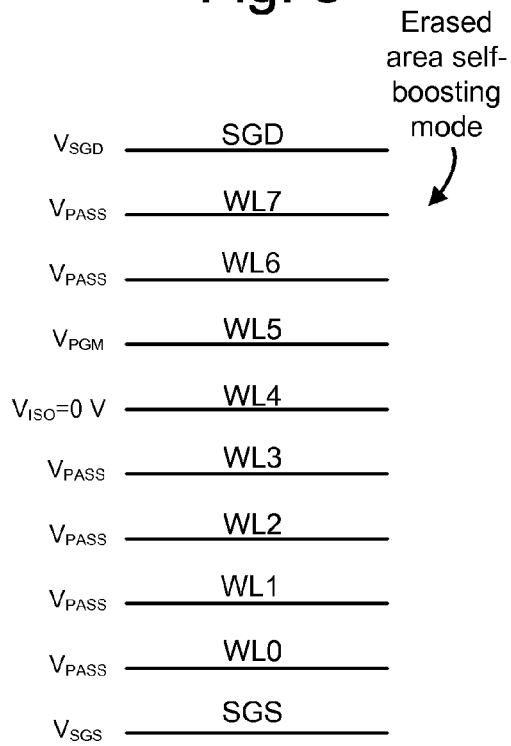
FIG. 5 depicts an erased area self-boosting mode implemented via a plurality of word lines.

FIG. 5 depicts an erased area self-boosting mode implemented via a plurality of word lines. Generally, various types of boosting modes have been developed to combat program disturb. During programming of storage elements on a selected word line, the boosting modes are implemented by applying a set of voltages to unselected word lines which are in communication with storage elements which are not currently being programmed. The storage elements which are being programmed are associated with selected NAND strings while other storage elements are associated with unselected NAND strings. Program disturb generally involves storage elements in the unselected NAND strings.

In this example, there are eight word lines, e.g., control lines, labeled WL0 through WL7, a source-side select gate control line labeled SGS and a drain-side select gate control line labeled SGD. A set of voltages which is applied to the control lines is also depicted. WL5 is designated as the selected word line as an illustration. Programming typically proceeds one word line at a time, from the source side to the drain side of a NAND string. The voltages which are applied include $V_{SGS}$, which is applied to the source-side select gate control line SGS, a pass voltage, $V_{PASS}$, which is applied to each of the unselected word lines, WL0-WL3, WL6 and WL7, a program voltage, $V_{PGM}$, which is applied to the selected word line WL5, an isolation voltage $V_{ISO}$ which is applied to WL4, the word line which is adjacent to the selected word line on the source side, and $V_{SGD}$, which is applied via the drain-side select gate control line SGD. Typically, $V_{SGS}$ is 0 V so that the source-side select gate is off, when a source supply voltage $V_{SOURCE}$ is about 2.5 V. $V_{SGD}$ is about 2.5 V so that the drain-side select gate is on for the selected NAND strings, due to application of a corresponding low bit line voltage $V_{BL}$ such as 0-1 V. The drain-side select gate is off for the unselected/inhibited NAND strings, due to application of a corresponding higher $V_{BL}$ such as 1.5-3 V.

Additionally, $V_{PASS}$ can be about 7-10 V and $V_{PGM}$ can vary from about 12-20 V. In one programming scheme, a pulse train of program voltages is applied to the selected word line. See FIG. 20. The amplitude of each successive program pulse in the pulse train increases in a staircase manner, typically by about 0.3-0.5 V per pulse. Further, verify pulses can be applied between program pulses to verify whether the selected storage elements have reached a target programming condition. Note also that each individual program pulse can have a fixed amplitude, or can have a varying amplitude. For example, some programming schemes apply a pulse with an amplitude which varies like a ramp or staircase. Any type of program pulse can be used.

With WL5 as the programmed word line, and programming proceeding from the source side to the drain side of each NAND string, the storage elements associated with WL0-WL4 will have already been programmed and the storage elements associated with WL6 and WL7 will be erased when the storage elements on WL5 are being programmed. The pass voltages on the unselected word lines couple to the channels associated with the unselected NAND strings, causing a voltage to exist in the channels of the unselected NAND strings which tends to reduce program disturb by lowering the voltage across the tunnel oxide of the storage elements.

Figure 6:
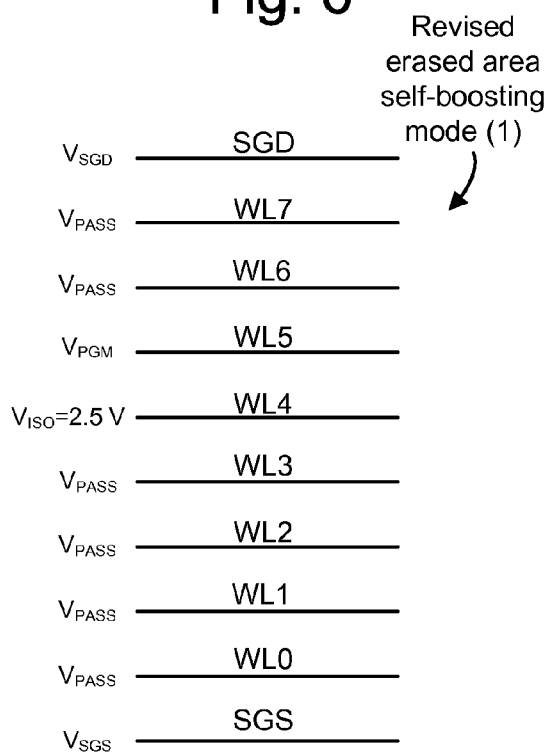
FIG. 6 depicts a first revised erased area self-boosting mode implemented via a plurality of word lines.

FIG. 6 depicts a first revised erased area self-boosting mode implemented via a plurality of word lines. In one approach, the first REASB mode is depicted by example word lines WL0-WL7 which communicate with a set of storage elements arranged in NAND strings. REASB is similar to EASB but applies a small isolation voltage, $V_{ISO}$, such as 2.5 V, instead of 0 V, to the word line which is adjacent to the selected word line on the source side. In this example, WL5 is the selected word line and WL4 is the adjacent word line. The remaining unselected word lines receive $V_{PASS}$.

FIG. 7a depicts a second revised erased area self-boosting mode implemented via a plurality of word lines. In one approach, the second REASB mode is depicted by example word lines which communicate with a set of storage elements arranged in NAND strings. In this case, an isolation voltage, $V_{ISO}$, is applied to WL3, and a low voltage, $V_{LOW}$, which is between $V_{ISO}$ and $V_{PASS}$, is applied to WL4, where WL5 is the selected word line. $V_{LOW}$ can also be considered to be an isolation voltage. In this approach, $V_{LOW}$ serves as an intermediate voltage so that there is not an abrupt voltage change in the channel between the selected word line (WL5) and the adjacent source side word line (WL4). For example, $V_{LOW}$ may be, e.g., 4 V and $V_{ISO}$ may be, e.g., 0 V or 2.5 V. The remaining unselected word lines receive $V_{PASS}$. Various other approaches can be used as well. For example, there may be isolation voltages on three adjacent source-side word lines (e.g., WL2-WL4).

FIG. 7b depicts a third revised erased area self-boosting mode implemented via a plurality of word lines. In one approach, the third REASB mode is depicted by example word lines which communicate with a set of storage elements arranged in NAND strings. In this case, the source-side word line (WL4) adjacent to the selected word line (WL5) receives $V_{PASS}$, the next word line (WL3) receives $V_{LOW}$ and the next word line after that (WL2) receives $V_{ISO}$. The remaining unselected word lines receive $V_{PASS}$. This boosting mode is also discussed in connection with FIG. 4. $V_{PASS}$ is applied to a first group of storage elements associated with WL0 and WL1, where the first group is adjacent to the source side select gate. Also, $V_{PASS}$ is applied to a second group of storage elements associated with WL6 and WL7, where the second group is adjacent to the drain side select gate.

FIG. 8 depicts a delay between the start of source side boosting and the start of drain side boosting as a function of selected word line position. In one approach, it is proposed that, at the initiation of boosting, the source side word line voltages are ramped up to $V_{PASS}$ while the drain side word line voltages remain at 0 V, and after a delay, the drain side word line voltages are also ramped up to $V_{PASS}$. In other words, the source side channel potential of the substrate on which the storage elements are formed is boosted early relative to the drain side channel potential. The programming order proceeds generally word line-by-word line from the source side of a set of storage elements to a drain side of the set of storage elements. Further, the programming can be single pass or multi-pass. The horizontal axis depicts the selected word line position and the vertical axis depicts a delay between the start of the source side boosting (on a source side of the selected word line) and a start of the drain side boosting (on a drain side of the selected word line). As indicated by the curve 800, a delay of 0 μsec. can be used when the selected word line is close to the source side or generally at a mid-range, while a non-zero delay can be used when the selected word line is close to the drain side. In one example implementation, a delay of a few microseconds such as 3-4 μsec. is used when the selected word line is WL24-WL31 on a 32-word line NAND memory device, or otherwise approximately in the highest 25% of the word lines. The delay is a relatively short period which is sufficient to ensure than the isolation storage element is off.

Figure 9:
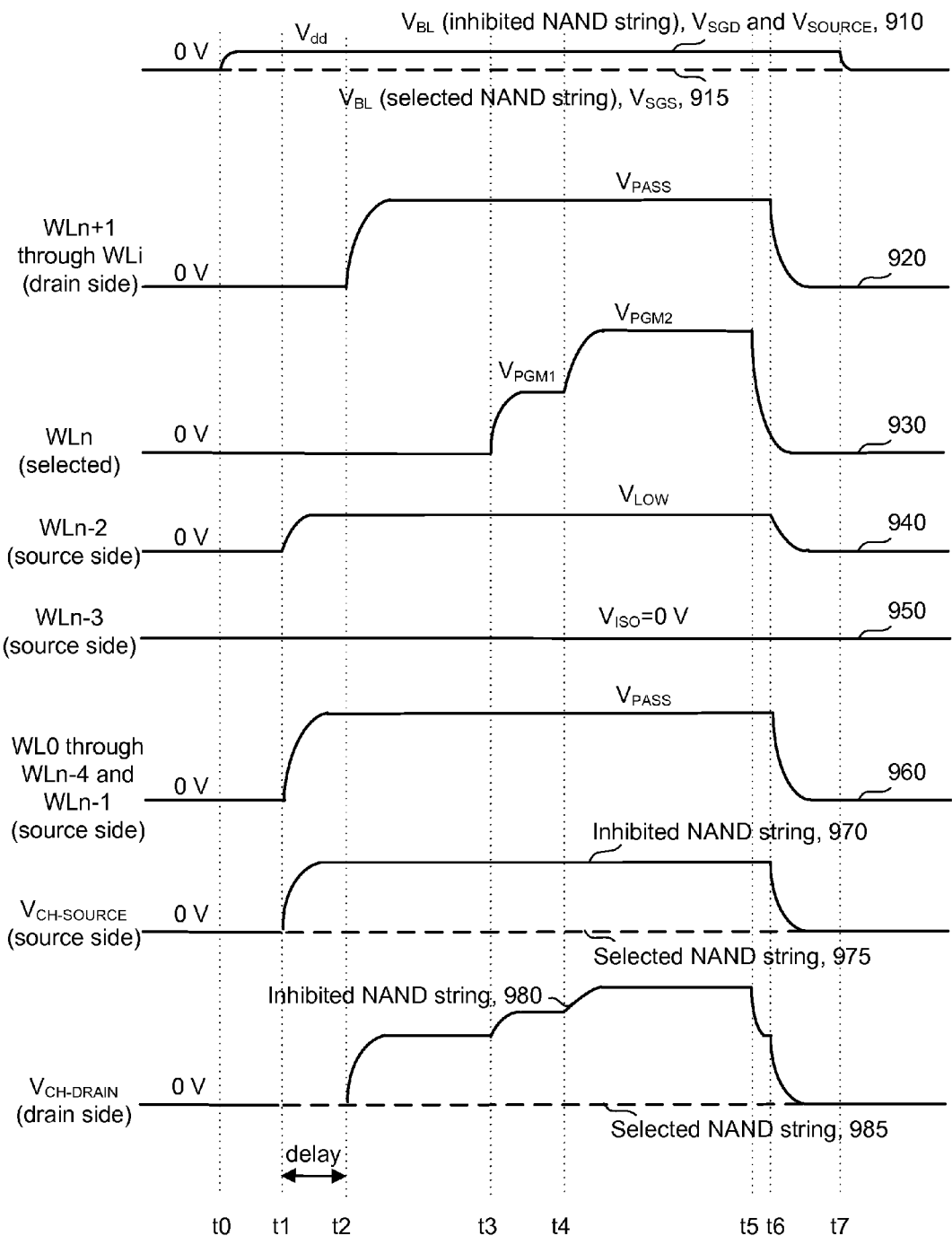
FIG. 9 depicts a time line showing word line voltages when source side boosting is initiated before drain side boosting.

FIG. 9 depicts a time line showing word line voltages when source side boosting is initiated before drain side boosting. The time period shown depicts a single cycle of boosting and programming using a programming pulse. This cycle is typically followed by a sequence of verify pulses to determine if the storage elements have reached a desired programming state. The cycle of boosting and programming is then repeated using another programming pulse, typically at a stepped-up amplitude. See FIG. 20. Note also that the time period shown may be preceded by a pre-charge period in which the drain side channel is boosted by a bit line voltage $V_{dd}$ which is transferred to the channel by opening the drain select gate. Typically, 0 V is applied to the word lines during pre-charging. However, pre-charging is not needed to realize benefits from early source side boosting.

Along the bottom of the time line are time points t0-t7. Time point t0 denotes the start of a boosting and programming cycle. Time point t1 denotes the initiation of boosting on the source side of the selected word line. Time point t2 denotes the initiation of boosting on the drain side of the selected word line. Time point t3 denotes the initiation of a programming voltage, e.g., the first step of a two-step programming voltage. Time point t4 denotes the initiation of the second step of the programming voltage. Time point t5 denotes the termination of the programming voltage. Time point t6 denotes the termination of the boosting voltages. Time point t7 denotes the termination of the boosting and programming cycle.

In particular, at t0, as indicated by waveform 910, the bit line voltage, $V_{BL}$, for the inhibited (unselected) NAND strings and the drain select gate voltage, $V_{SGD}$, are increased from 0 V to $V_{dd}$, e.g., 2.5 V. This ensures that the drain select gate for inhibited NAND strings remains closed. Also, the source voltage, $V_{SOURCE}$, increases from 0 V to $V_{dd}$. With the source select gate voltage, $V_{SGS}$, at 0 V (waveform 915), this ensures that the source select gate for all NAND strings remains closed. For selected NAND strings, $V_{BL}$=0 so that, with $V_{SGD}$=$V_{dd}$, the drain select gate is open to allow programming to occur. The example provided corresponds to the revised erased area boosting scheme of FIG. 7b. However, essentially any type of boosting scheme which uses one or more source side isolation word lines may be used.

Waveform 920 depicts the voltage ($V_{PASS}$) applied to the word lines on the drain side of the selected word line. WLi denotes the ith or highest word line and WLn+1 denotes the word line adjacent to the selected word line (WLn) on the drain side. Waveform 930 depicts programming voltages ($V_{PGM1}$ and $V_{PGM2}$) applied to the selected word line (WLn). Waveform 940 depicts the voltage ($V_{LOW}$) applied to a word line (WLn-2) which is two word lines away from the selected word line on the source side. Waveform 950 depicts the isolation voltage ($V_{ISO}$) applied to a word line (WLn-3) which is three word lines away from the selected word line on the source side. Waveform 960 depicts the voltage ($V_{PASS}$) applied to the remaining unselected word lines, including a word line (WLn-1) which is adjacent to the selected word line on the source side, and word lines (WL0 through WLn-4) which extend from the first word line (WL0) to a word line (WLn-4) which is four word lines away from the selected word line on the source side. Waveforms 970 and 975 depict the channel potential ($V_{CH-SOURCE}$) which exists in the channel of the substrate on the source side of the selected word line, for the inhibited and selected NAND strings, respectively. Waveforms 980 and 985 depict the channel potential ($V_{CH-DRAIN}$) which exists in the channel of the substrate on the drain side of the selected word line, for the inhibited and selected NAND strings, respectively. Note how $V_{CH-DRAIN}$ (waveform 980) tracks the program voltage (waveform 930).

At t0, the drain and source select gates are kept closed for the inhibited NAND strings. At t1, boosting of the source side channel is initiated by applying $V_{LOW}$ (waveform 940), $V_{ISO}$ (waveform 950) and $V_{PASS}$ (waveform 960). Note the corresponding increase in $V_{CH-SOURCE}$ (waveform 970). Between t1 and t2, boosting of the source side channel continues. After a delay, at t2, boosting of the drain side channel is initiated by applying $V_{PASS}$ (waveform 920). Note the corresponding increase in $V_{CH-DRAIN}$ (waveform 980). Boosting of the source and drain side channels continues until t6. At t3, the programming voltage $V_{PGM1}$ is applied and, at t4, the programming voltage $V_{PGM2}$ is applied. Thus, the program voltage can be applied initially at a first level and subsequently at a higher second level. This approach avoids abrupt changes in $V_{CH-DRAIN}$ which may be caused by abrupt changes in $V_{PGM}$. However, a single stepped $V_{PGM}$ pulse may alternatively be used. At t6, the boosting voltages are removed and, at t7, the boosting and programming cycle ends. The program voltage $V_{PGM2}$ is removed at t5, just prior to the removal of the boosting voltages at t6.

Figure 10:
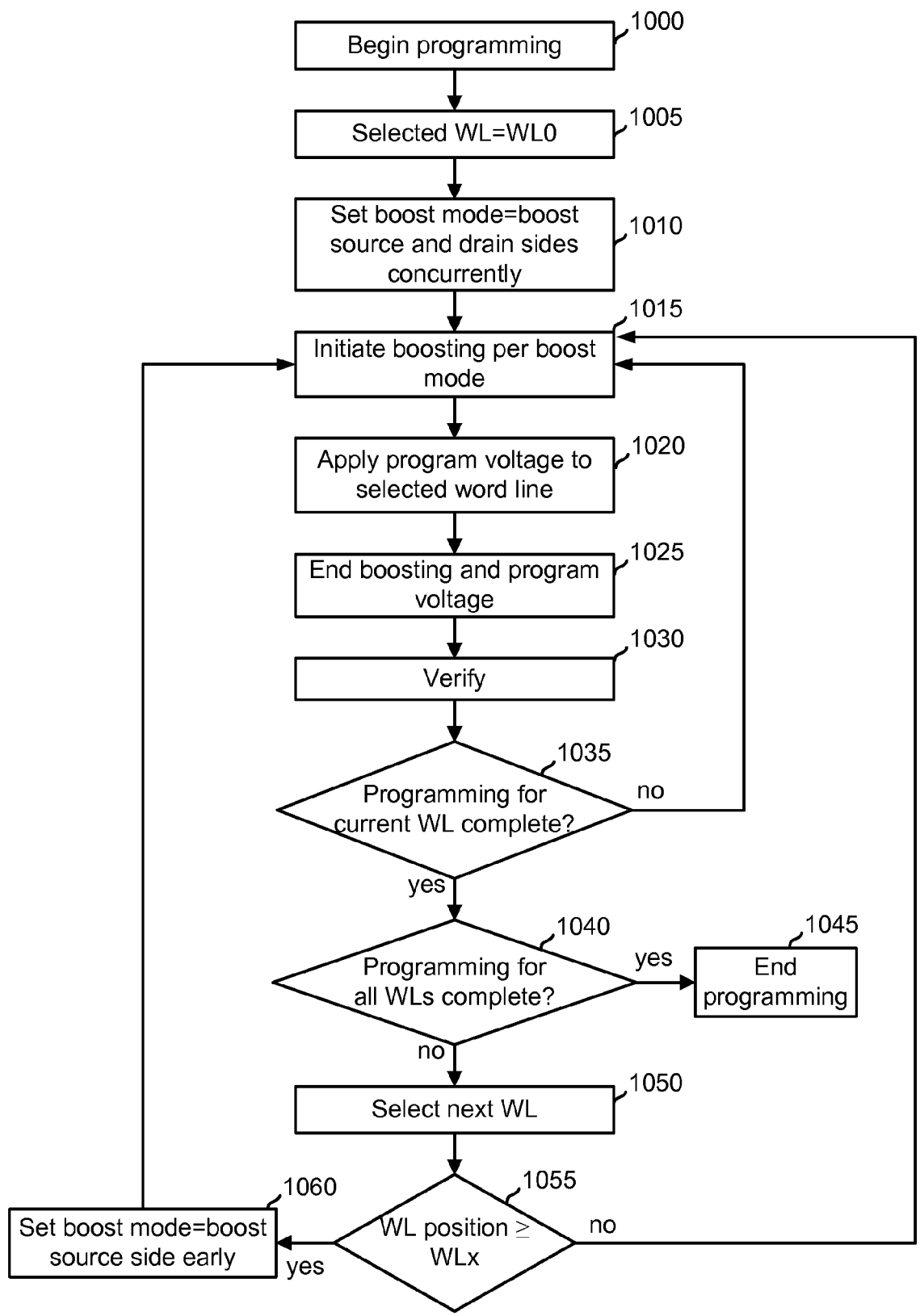
FIG. 10 depicts a process for switching a boost mode during programming based on a selected word line position.

FIG. 10 depicts a process for switching a boost mode during programming based on a selected word line position. In one example approach, the boost mode is switched from a mode in which boosting of the source and drain side channels is initiated substantially concurrently to a mode in which the source side boosting is initiated early relative to the drain side boosting. In other words, the different boost modes involve a change in timing between initiation of the source side boosting and drain side boosting.

At step 1000, programming begins. At step 1005, a variable in memory which tracks the selected word line position is initialized to WL0. At step 1010, a variable in memory which identifies the current boost mode is set to indicate that the source and drain sides are to be boosted concurrently. At step 1015, boosting of the source and drain sides is initiated based on the current boost mode. At step 1020, a program voltage is applied to the currently selected word line (e.g., WL0). At step 1025, the boosting and program voltage end. At step 1030, a verify process is performed to determine if the storage elements which are being programmed have a reached a desired programming state. At decision step 1035, a determination is made as to whether the verify process indicates that programming is complete for the current word line. If programming for the current word line is not complete, the control flow continues at step 1015 with another boost and program cycle until programming for the current word line is complete. When programming for the current word line is complete, a determination is made at decision step 1040 as to whether programming is complete for all word lines. If programming is complete for all word lines, the programming ends at step 1045. If programming is not complete for all word lines, the next word line is selected for programming at step 1050.

A determination is made at decision step 1055 as to whether the current word line position is at or above a specified word line position (WLx). For example, WLx can be WL24 for a 32-word line NAND memory device. If the current word line position is not at or above the specified word line position, the control flow continues at step 1015 with another boost and program cycle. If the current word line position is at or above the specified word line position, the boost mode is set to indicate that the source side is to be boosted early relative to the drain side at step 1060, and the control flow continues at step 1015 with another boost and program cycle.

Figure 11:
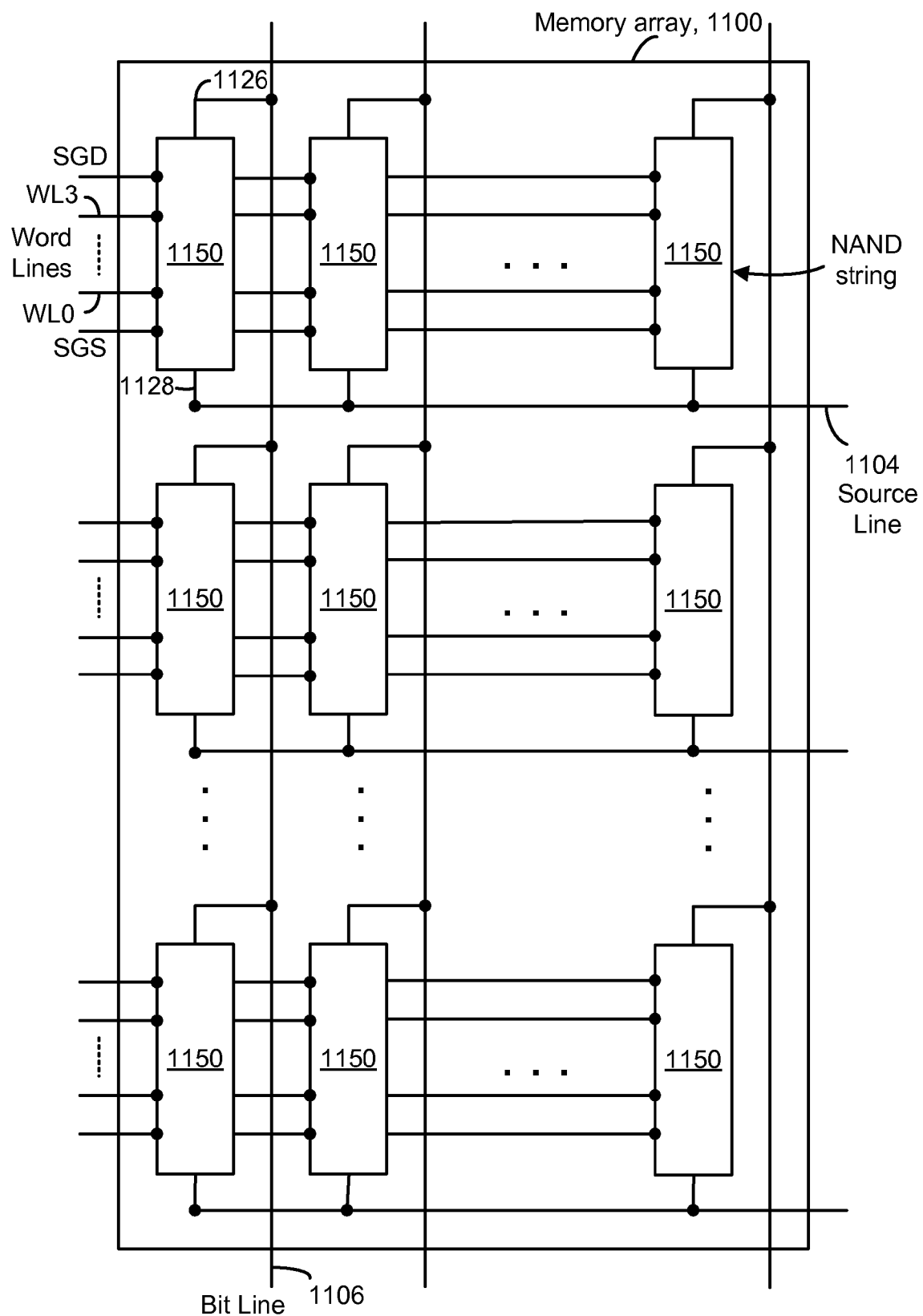
FIG. 11 is a block diagram of an array of NAND flash storage elements.

FIG. 11 illustrates an example of an array 1100 of NAND storage elements, such as those shown in FIGS. 1 and 2. Along each column, a bit line 1106 is coupled to the drain terminal 1126 of the drain select gate for the NAND string 1150. Along each row of NAND strings, a source line 1104 may connect all the source terminals 1128 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 12:
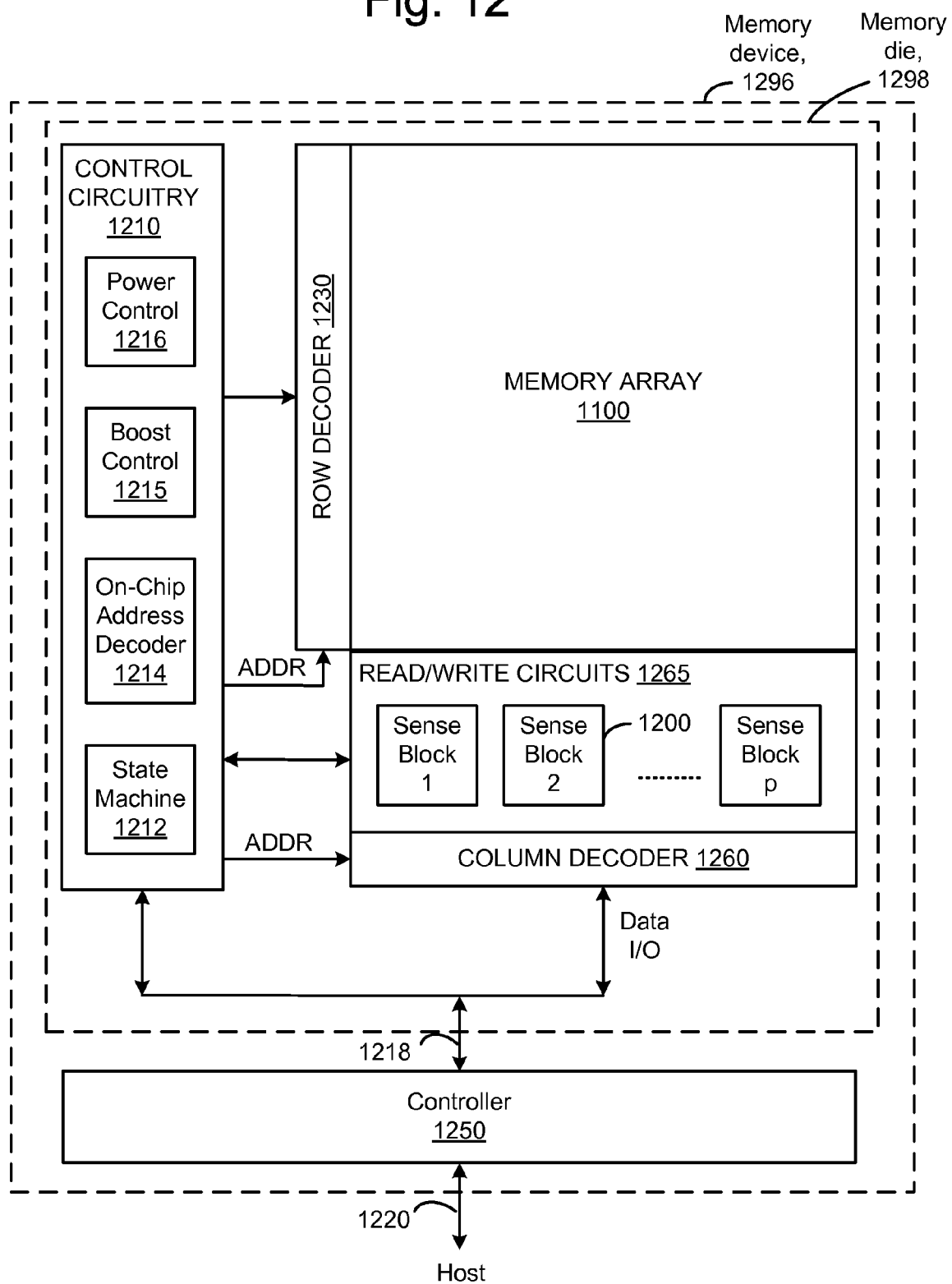
FIG. 12 is a block diagram of a non-volatile memory system using single row/column decoders and read/write circuits.

FIG. 12 is a block diagram of a non-volatile memory system using single row/column decoders and read/write circuits. The diagram illustrates a memory device 1296 having read/write circuits for reading and programming a page of storage elements in parallel, according to one embodiment of the present invention. Memory device 1296 may include one or more memory die 1298. Memory die 1298 includes a two-dimensional array of storage elements 1100, control circuitry 1210, and read/write circuits 1265. In some embodiments, the array of storage elements can be three dimensional. The memory array 1100 is addressable by word lines via a row decoder 1230 and by bit lines via a column decoder 1260. The read/write circuits 1265 include multiple sense blocks 1200 and allow a page of storage elements to be read or programmed in parallel. Typically a controller 1250 is included in the same memory device 1296 (e.g., a removable storage card) as the one or more memory die 1298. Commands and Data are transferred between the host and controller 1250 via lines 1220 and between the controller and the one or more memory die 1298 via lines 1218.

The control circuitry 1210 cooperates with the read/write circuits 1265 to perform memory operations on the memory array 1100. The control circuitry 1210 includes a state machine 1212, an on-chip address decoder 1214, a boost control 1215 and a power control module 1216. The state machine 1212 provides chip-level control of memory operations. The on-chip address decoder 1214 provides an address interface between that used by the host or a memory controller to the hardware address used by the decoders 1230 and 1260. The boost control 1215 can be used for setting a boost mode, including determining a timing for initiating source side and drain side boosting, as discussed herein. The power control module 1216 controls the power and voltages supplied to the word lines and bit lines during memory operations.

In some implementations, some of the components of FIG. 12 can be combined. In various designs, one or more of the components (alone or in combination), other than storage element array 1100, can be thought of as a managing circuit. For example, one or more managing circuits may include any one of or a combination of control circuitry 1210, state machine 1212, decoders 1214/1260, power control 1216, sense blocks 1200, read/write circuits 1265, controller 1250, etc.

Figure 13:
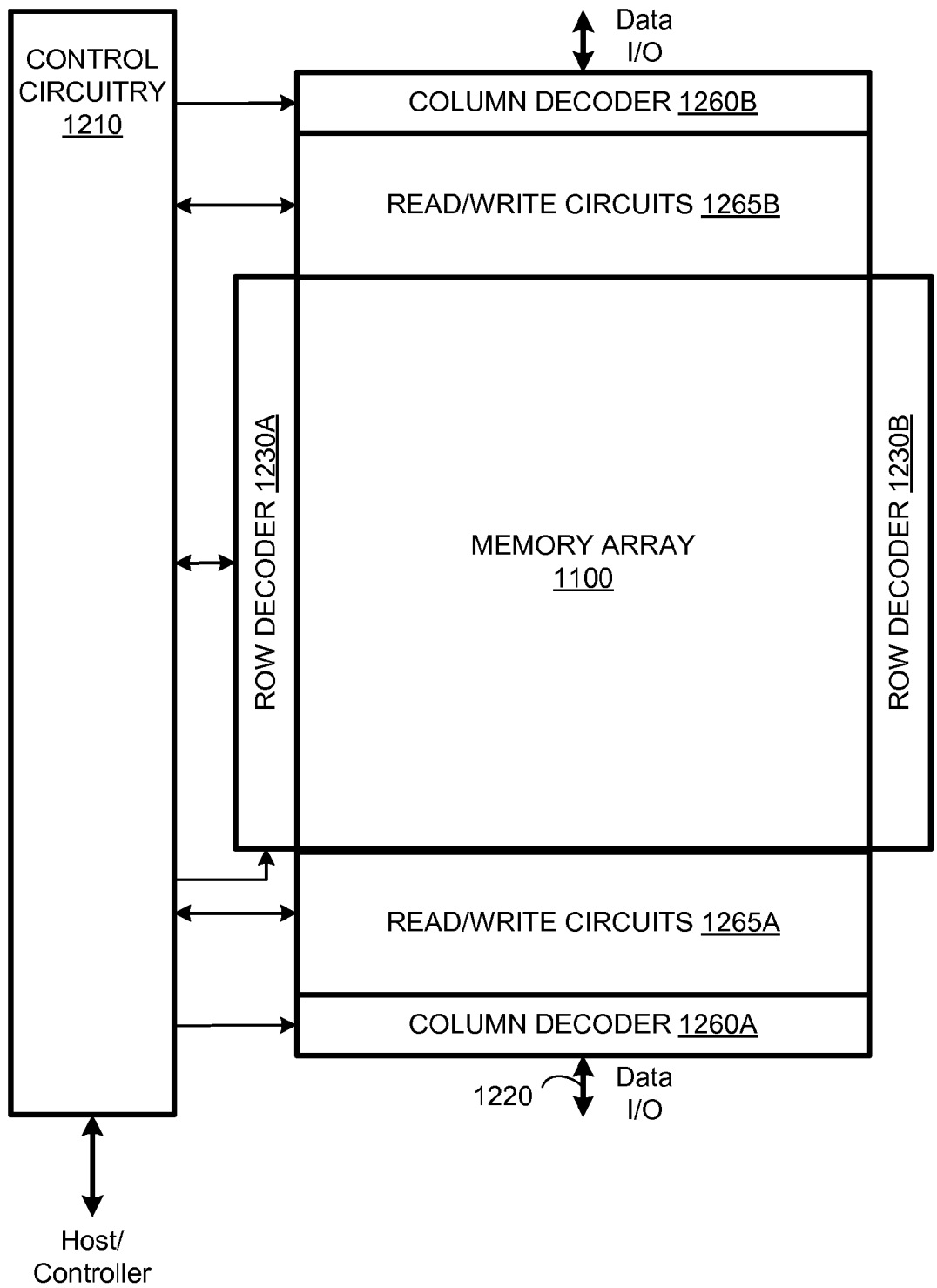
FIG. 13 is a block diagram of a non-volatile memory system using dual row/column decoders and read/write circuits.

FIG. 13 is a block diagram of a non-volatile memory system using dual row/column decoders and read/write circuits. Here, another arrangement of the memory device 1296 shown in FIG. 12 is provided. Access to the memory array 1100 by the various peripheral circuits is implemented in a symmetric fashion, on opposite sides of the array, so that the densities of access lines and circuitry on each side are reduced by half. Thus, the row decoder is split into row decoders 1230A and 1230B and the column decoder into column decoders 1260A and 1260B. Similarly, the read/write circuits are split into read/write circuits 1265A connecting to bit lines from the bottom and read/write circuits 1265B connecting to bit lines from the top of the array 1100. In this way, the density of the read/write modules is essentially reduced by one half. The device of FIG. 13 can also include a controller, as described above for the device of FIG. 12.

Figure 14:
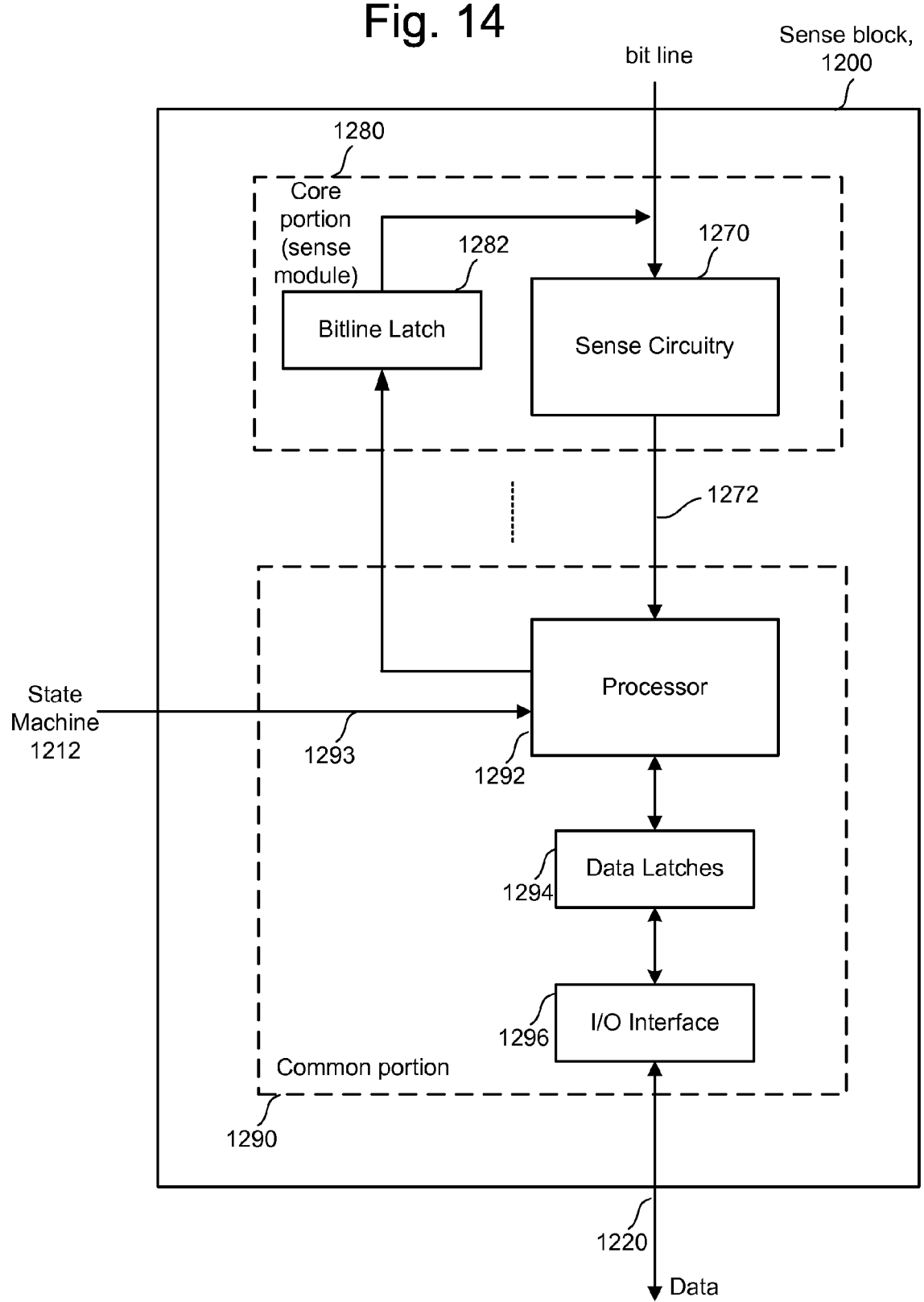
FIG. 14 is a block diagram depicting one embodiment of a sense block.

FIG. 14 is a block diagram depicting one embodiment of a sense block. An individual sense block 1200 is partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details refer to U.S. Patent Application Pub No. 2006/0140007, titled "Non-Volatile Memory and Method with Shared Processing for an Aggregate of Sense Amplifiers" published Jun. 29, 2006, and incorporated herein by reference in its entirety.

Sense module 1280 comprises sense circuitry 1270 that determines whether a conduction current in a connected bit line is above or below a predetermined threshold level. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., $V_{dd}$).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed storage element and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1212 that controls the supply of different control gate voltages to the addressed storage element. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1292 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1294 from the data bus 1220. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1292 monitors the read back memory state relative to the desired memory state. When the two are in agreement, the processor 1292 sets the bit line latch 1282 so as to cause the bit line to be pulled to a state designating program inhibit. This inhibits the storage element coupled to the bit line from further programming even if programming pulses appear on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are three data latches per sense module 1280. In some implementations (but not required), the data latches are implemented as a shift register so that the parallel data stored therein is converted to serial data for data bus 1220, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," filed on Dec. 16, 2004; (4) U.S. patent application Ser. No. 11/099,133, titled "Compensating for Coupling During Read Operations of Non-Volatile Memory," filed on Apr. 5, 2005; and (5) U.S. patent application Ser. No. 11/321,953, titled "Reference Sense Amplifier For Non-Volatile Memory, filed on Dec. 28, 2005. All five of the immediately above-listed patent documents are incorporated herein by reference in their entirety.

Figure 15:
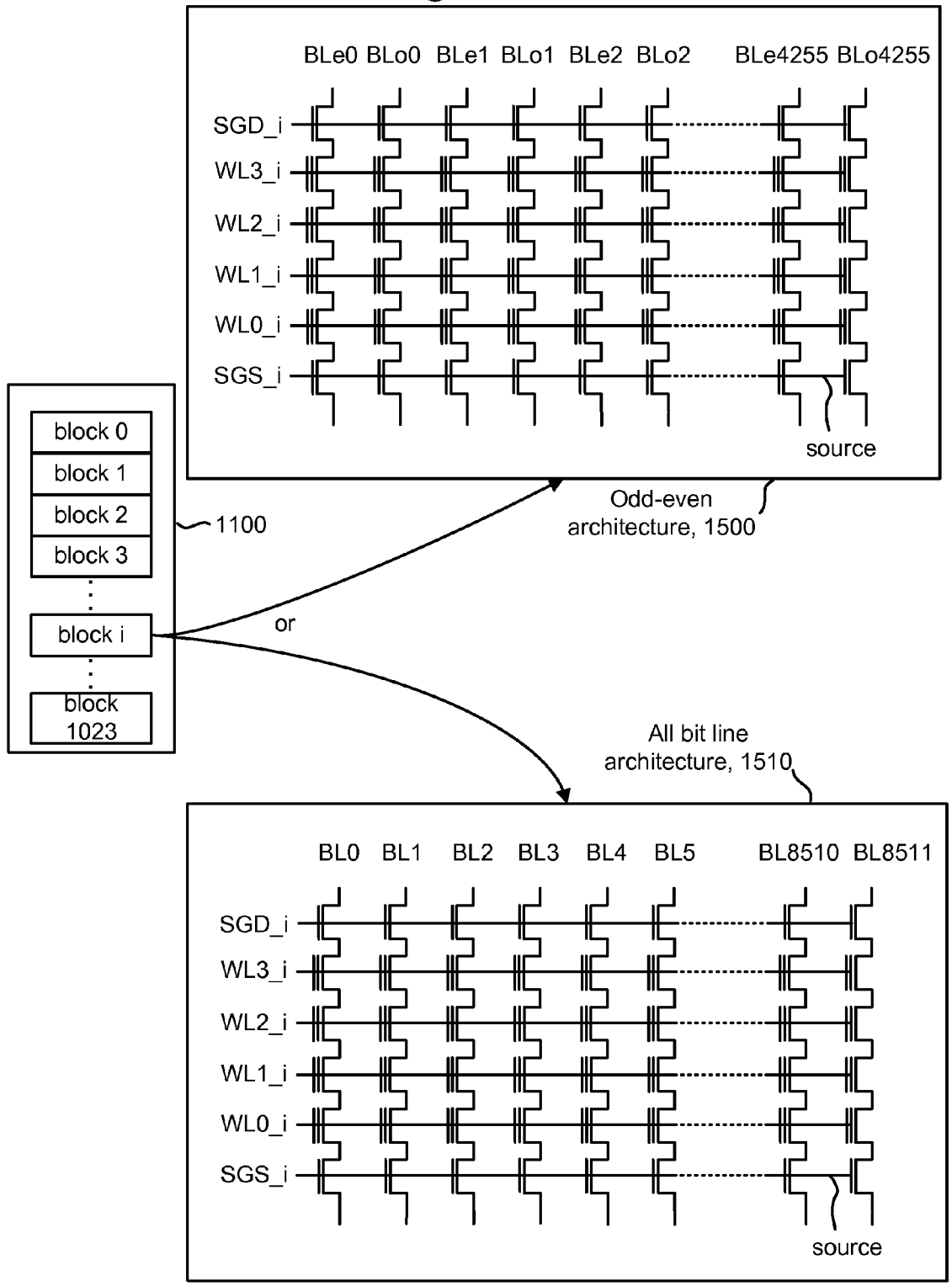
FIG. 15 illustrates an example of an organization of a memory array into blocks for an all bit line memory architecture or for an odd-even memory architecture.

FIG. 15 illustrates an example of an organization of a memory array into blocks for an all bit line memory architecture or for an odd-even memory architecture. Exemplary structures of memory array 1100 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1510), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1500), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 16:
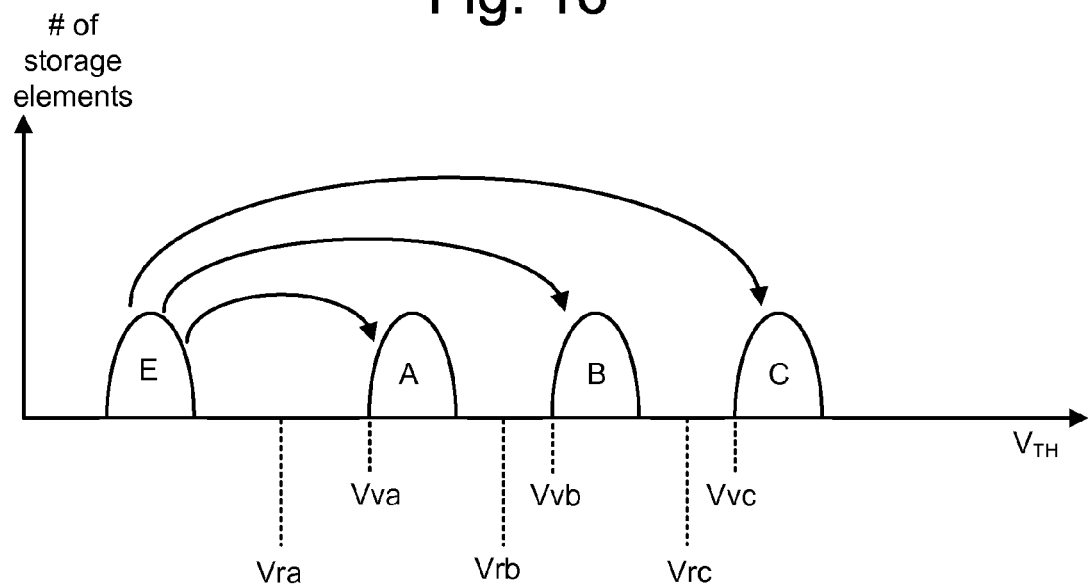
FIG. 16 depicts an example set of threshold voltage distributions.

FIG. 16 depicts an example set of threshold voltage distributions. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Publication No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 20 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 is a maximized since the change in amount of charge on the floating gate under WLn is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLn−1 will vary depending on the state of the adjacent storage element on WLn.

Figure 17:
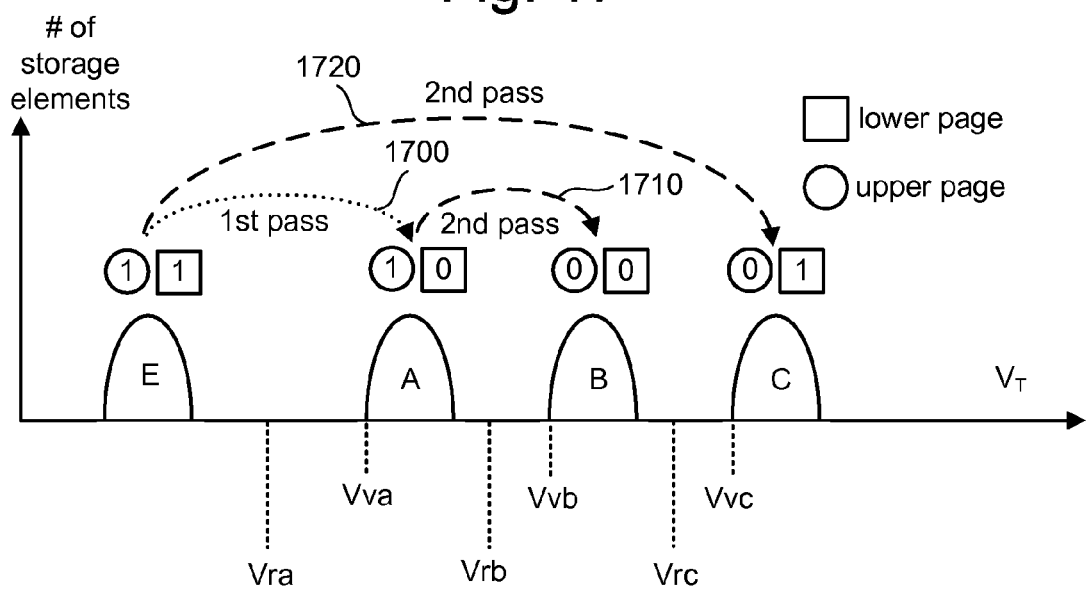
FIG. 17 depicts an example set of threshold voltage distributions.

FIG. 17 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1100. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1720. If the storage element had been programmed into state A as a result of the first programming pass, then the storage element is further programmed in the second pass so that the threshold voltage is increased to be within state B, as depicted by arrow 1710. The result of the second pass is to program the storage element into the state designated to store a logic "0" for the upper page without changing the data for the lower page. In both FIG. 16 and FIG. 17, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, incorporated herein by reference in its entirety.

Figure 18A:
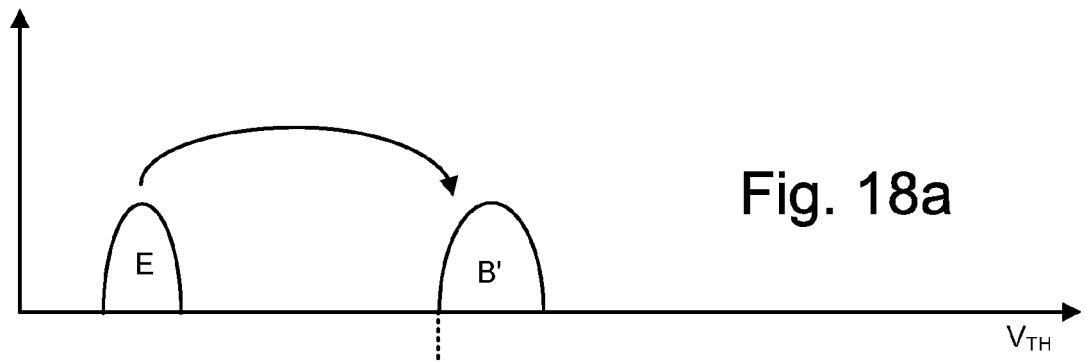
FIGS. 18a-c show various threshold voltage distributions and describe a process for programming non-volatile memory.
Figure 18B:
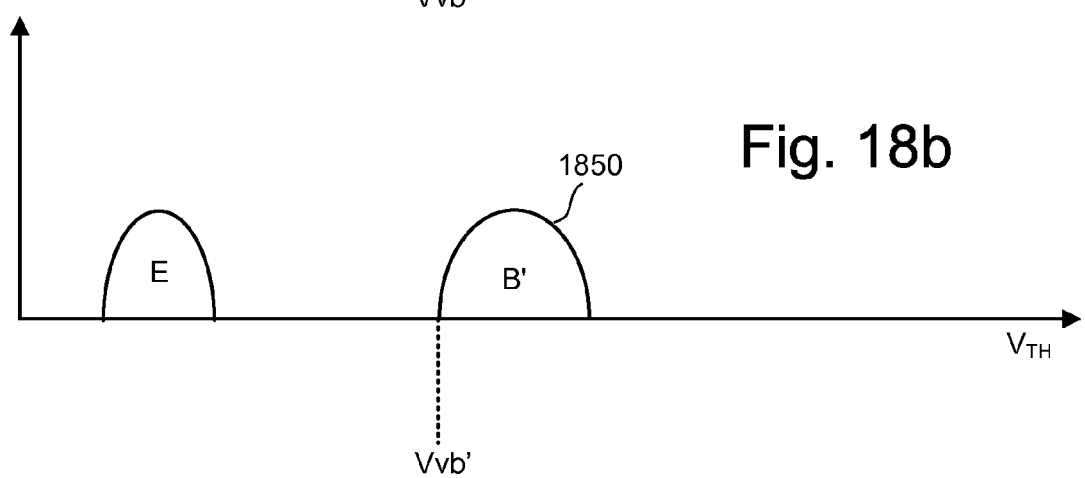
Figure 18C:
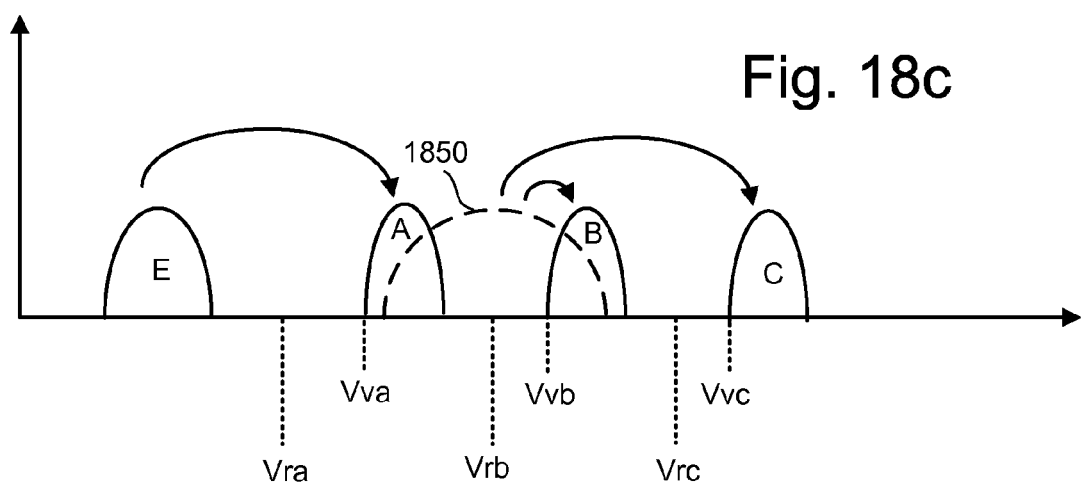

FIGS. 18a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 18a therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1850 of FIG. 18b. This apparent widening of the threshold voltage distribution will be remedied when programming the upper page.

FIG. 18c depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1850 and the upper page data is to remain at 1, then the storage element will be programmed to final state B. If the storage element is in intermediate threshold voltage distribution 1850 and the upper page data is to become data 0, then the threshold voltage of the storage element will be raised so that the storage element is in state C. The process depicted by FIGS. 18a-c reduces the effect of floating gate to floating gate coupling because only the upper page programming of neighbor storage elements will have an effect on the apparent threshold voltage of a given storage element. An example of an alternate state coding is to move from distribution 1850 to state C when the upper page data is a 1, and to move to state B when the upper page data is a 0.

Although FIGS. 18a-c provide an example with respect to four data states and two pages of data, the concepts taught can be applied to other implementations with more or fewer than four states and different than two pages.

Figure 19:
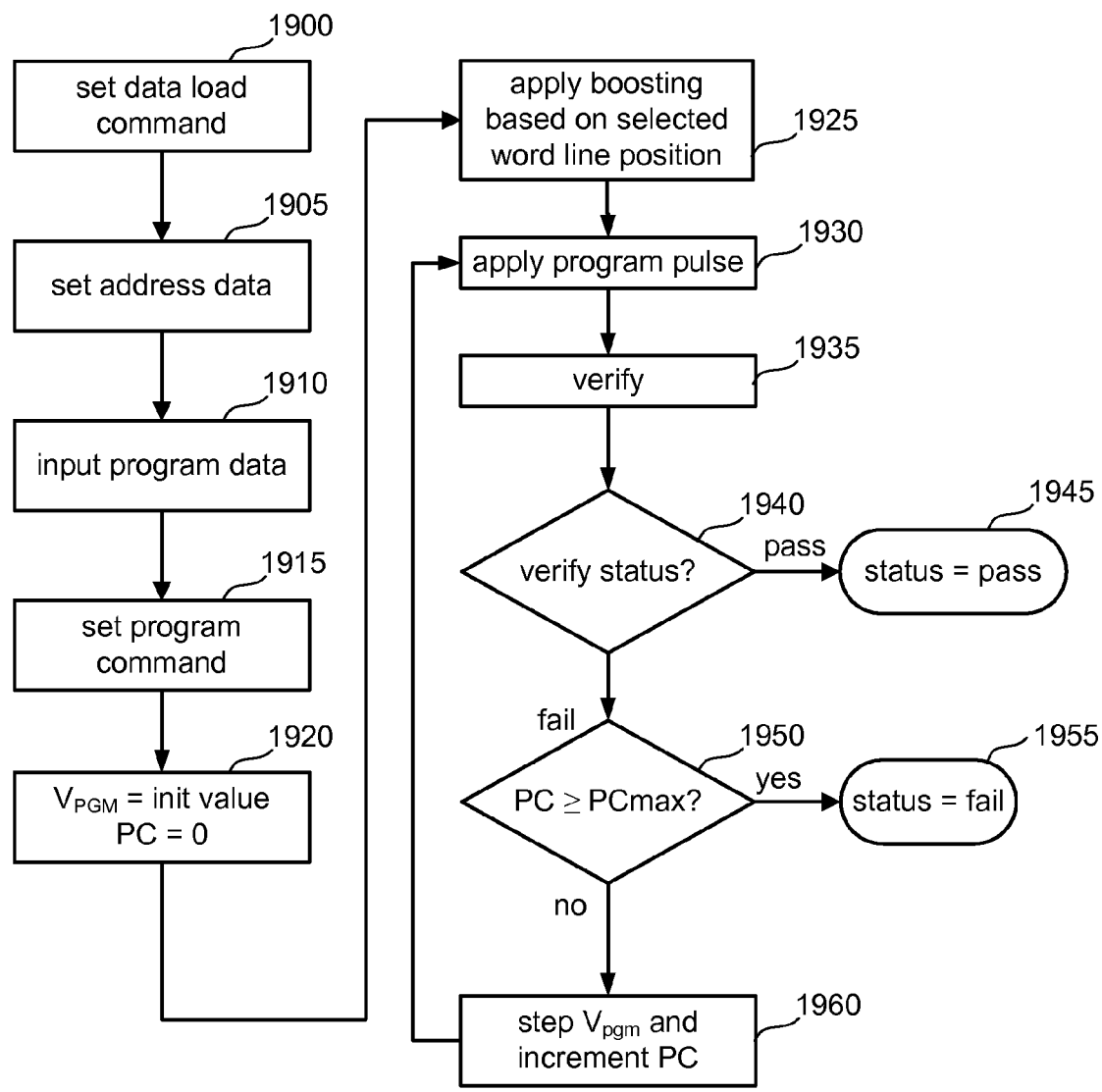
FIG. 19 is a flow chart describing one embodiment of a process for programming non-volatile memory.

FIG. 19 is a flow chart describing one embodiment of a method for programming non-volatile memory. In one implementation, storage elements are erased (in blocks or other units) prior to programming. In step 1900, a "data load" command is issued by the controller and input received by control circuitry 1210. In step 1905, address data designating the page address is input to decoder 1214 from the controller or host. In step 1910, a page of program data for the addressed page is input to a data buffer for programming. That data is latched in the appropriate set of latches. In step 1915, a "program" command is issued by the controller to state machine 1212.

Figure 20:
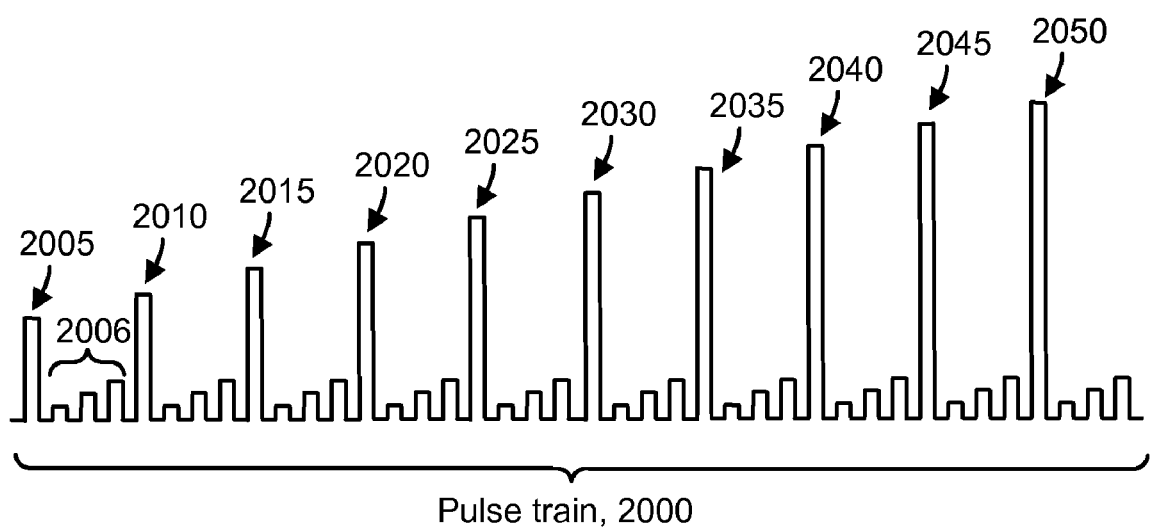
FIG. 20 depicts an example pulse train applied to the control gates of non-volatile storage elements during programming.

Triggered by the "program" command, the data latched in step 1910 will be programmed into the selected storage elements controlled by state machine 1212 using the stepped program pulses of the pulse train 2000 of FIG. 20 applied to the appropriate selected word line. In step 1920, the program voltage, $V_{PGM}$, is initialized to the starting pulse (e.g., 12 V or other value) and a program counter (PC) maintained by state machine 1212 is initialized at zero. In step 1925, boosting is applied based a currently set boost mode (e.g., boost source and drain sides concurrently or boost source side early). The current boost mode can be a function of the currently selected word line position, for instance, as discussed. In another approach, the boost mode is fixed or otherwise independent of the word line position. For instance, the source side can be boosted early for all selected word line positions.

In step 1930, the first VPGM pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to $V_{dd}$ to inhibit programming.

In step 1935, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 1940, a check is made as to whether all of the data latches are storing logic "1." If all of the data latches are storing logic "1," the programming process is complete and successful because all selected storage elements were programmed and verified. A status of "PASS" is reported in step 1945.

If, in step 1940, it is determined that not all of the data latches are storing logic "1," then the programming process continues. In step 1950, the program counter PC is checked against a program limit value PCmax. One example of a program limit value is twenty; however, other numbers can also be used. If the program counter PC is not less than PCmax, then the program process has failed and a status of "FAIL" is reported in step 1955. If the program counter PC is less than PCmax, then $V_{PGM}$ is increased by the step size and the program counter PC is incremented in step 1960. The process then loops back to step 1930 to apply the next $V_{PGM}$ pulse.

FIG. 20 depicts an example pulse train 2000 applied to the control gates of non-volatile storage elements during programming, and a switch in boost mode which occurs during a pulse train. The pulse train 2000 includes a series of program pulses 2005, 2010, 2015, 2020, 2025, 2030, 2035, 2040, 2045, 2050, . . . , that are applied to a word line selected for programming. In one embodiment, the programming pulses have a voltage, $V_{PGM}$, which starts at 12 V and increases by increments, e.g., 0.5 V, for each successive programming pulse until a maximum of 20 V is reached. In between the program pulses are verify pulses. For example, verify pulse set 2006 includes three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 17) or Vvb' (FIG. 18a), for instance.

As mentioned, the voltages which are applied to word lines to implement a boost mode are applied when programming occurs, e.g., prior to and during a program pulse. In practice, the boost voltages of a boost mode can be initiated slightly before each program pulse and removed after each program pulse. On the other hand, during the verify process, for instance, which occurs between program pulses, the boost voltages are not applied. Instead, read voltages, which are typically less than the boost voltages, are applied to the unselected word lines. The read voltages have an amplitude which is sufficient to maintain the previously programmed storage elements in a NAND string on when the threshold voltage of a currently-programmed storage element is being compared to a verify level.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage system, comprising:
    a set of non-volatile storage elements formed, at least in part, on a substrate, the set of non-volatile storage elements comprises NAND strings which extend between a source side select gate line and a drain side select gate line;
    a set of word lines associated with the set of non-volatile storage elements, including a selected word line which is associated with at least one non-volatile storage element of the set of non-volatile storage elements, and an isolation word line, a first region of the substrate extends from the isolation word line to the source side select gate line, and a second region of the substrate extends from the isolation word line to the drain side select gate line; and
    one or more control circuits in communication with the set of non-volatile storage elements, the one or more control circuits boost the first region starting at a first time, and initiate boosting of the second region starting at a second time which is after the first time, and apply a program voltage to the selected word line starting at a third time which is after the second time, and ending at a fourth time which is after the third time, where the first region is boosted between at least the first and third times and the second region is boosted between at least the second and third times, but not between the first and second times.

2. The non-volatile storage system of claim 1, wherein:
the one or more control circuits, during the boosting of the second region, raise a voltage applied to the set of word lines on the drain side of the isolation word line from an initial level to a final level, starting at the second time, and maintain the voltage at the final level at least until the third time.

3. The non-volatile storage system of claim 1, wherein:
the one or more control circuits boost the first and second regions and apply the program voltage to the at least one non-volatile storage element in a cycle of boosting and programming of a programming operation which comprises multiple cycles of boosting and programming.

4. The non-volatile storage system of claim 1, wherein:
the one or more control circuits boost the first region between the first and fourth times, and boost the second region between the second and fourth times.

5. The non-volatile storage system of claim 1, wherein:
the one or more control circuits boost the first region by raising a source side voltage applied to word lines of the set of word lines which are on the source side of the isolation word line to a source side higher level at the first time, and maintain the source side voltage at the source side higher level at least until the third time; and
the one or more control circuits boost the second region by raising a drain side voltage applied to word lines of the set of word lines which are on the drain side of the isolation word line to a drain side higher level at the first time, and maintain the drain side voltage at the drain side higher level at least until the third time.

6. The non-volatile storage system of claim 1, wherein:
the one or more control circuits boost the first region by raising a source side voltage applied to word lines of the set of word lines which are on the source side of the isolation word line from 0 V to a source side higher level at the first time, and maintain the source side voltage at the source side higher level at least until the third time; and
the one or more control circuits boost the second region by raising a drain side voltage applied to word lines of the set of word lines which are on the drain side of the isolation word line from 0 V to a drain side higher level at the second time, and maintain the drain side voltage at the drain side higher level at least until the third time.

7. A non-volatile storage system, comprising:
first and second groups of non-volatile storage elements in a set of non-volatile storage elements, the first group comprising programmed non-volatile storage elements and the second group comprising unprogrammed non-volatile storage elements; and
one or more control circuits in communication with the set of non-volatile storage elements, the one or more control circuits, in a cycle of boosting and programming of a programming operation which comprises multiple cycles of boosting and programming: a) apply pass voltages to the first and second groups of non-volatile storage elements, and b) apply a programming voltage to at least one non-volatile storage element in the set of non-volatile storage elements which is between the first and second groups, where the pass voltages are applied prior to the applying the programming voltage, the pass voltages are applied to the first group prior to being applied to the second group, and an isolation voltage is applied to at least one isolation non-volatile storage element in the set of non-volatile storage elements between the first and second groups.

8. The non-volatile storage system of claim 7, wherein:
the set of non-volatile storage elements is formed, at least in part, on a substrate, the pass voltages applied to the first group boost a first region of the substrate, on a source side of the isolation non-volatile storage element, and the pass voltages applied to the second group boost a second region of the substrate, on a drain side of the isolation non-volatile storage element, the second region extends under the second group and is adjacent to the isolation non-volatile storage element.

9. The non-volatile storage system of claim 7, wherein:
the pass voltages applied to the first group are applied using a first set of common voltage waveforms, and the pass voltages applied to the second group are applied use a second set of common voltage waveforms.

10. The non-volatile storage system of claim 7, wherein:
the one or more control circuits apply the pass voltages to the first and second groups of non-volatile storage elements via associated word lines.

11. The non-volatile storage system of claim 7, wherein:
the set of non-volatile storage elements is provided in at least one NAND string which extends between a source side select gate and a drain side select gate.

12. The non-volatile storage system of claim 11, wherein:
the first group extends from the source side select gate to the at least one isolation non-volatile storage element and the second group extends from the drain side select gate to the at least one isolation non-volatile storage element.

13. A non-volatile storage system, comprising:
a set of non-volatile storage elements formed, at least in part, on a substrate;
a set of word lines associated with the set of non-volatile storage elements, including a selected word line which is associated with at least one non-volatile storage element of the set of non-volatile storage elements, and an isolation word line; and
one or more control circuits in communication with the set of non-volatile storage elements, the one or more control circuits perform a cycle of boosting and programming of a programming operation which includes multiple cycles of boosting and programming, and, in the cycle of boosting and programming, the one or more control circuits: apply an isolation voltage to the isolation word line, program non-volatile storage elements in the set of non-volatile storage elements by applying a programming voltage on the selected word line and, prior to applying the programming voltage, the one or more control circuits initiate boosting of a first region of the substrate on a source side of the isolation word line and initiate boosting of a second region of the substrate on a drain side of the isolation word line, and determine when to implement a delay of the initiating boosting of the second region relative to the initiating boosting of the first region in the cycle of boosting and programming based on a position of the selected word line in the set of word lines.

14. The non-volatile storage system of claim 13, wherein:
the one or more control circuits continue to boost the second region of the substrate when applying the programming voltage on the selected word line.

15. The non-volatile storage system of claim 13, wherein:
the one or more control circuits boost the first region by applying a pass voltage to at least one word line in the set of word lines on the source side, and boost the second region by applying a pass voltage to at least one other word line in the set of word lines on the drain side.

16. The non-volatile storage system of claim 13, wherein:
the delay is implemented when the selected word line is within a specified number of word lines from a drain side of the set of non-volatile storage elements; and
the delay is not implemented when the selected word line is not within the specified number of word lines from the drain side, so that the initiating boosting of the first region occurs concurrently with the initiating boosting of the second region.

17. The non-volatile storage system of claim 16, wherein:
the specified number of word lines is approximately 25% of the word lines of the set of word lines.

18. The non-volatile storage system of claim 16, wherein:
the specified number of word lines consists of fewer than all word lines in the set of word lines.

19. The non-volatile storage system of claim 13, wherein:
the set of non-volatile storage elements is provided in at least one NAND string which extends between a source side select gate and a drain side select gate.

20. The non-volatile storage system of claim 19, wherein:
the non-volatile storage elements in the set of non-volatile storage elements are programmed in an order extending from the source side select gate to the drain side select gate.

* * * * *